US011830858B2

(12) United States Patent
Wang et al.

(10) Patent No.: US 11,830,858 B2
(45) Date of Patent: Nov. 28, 2023

(54) FULL-COLOR CHIP-ON-BOARD (COB) DEVICE

(71) Applicant: Foshan Evercore Optoelectronic Technology Co., Ltd., Guangdong (CN)

(72) Inventors: Mengyuan Wang, Guangdong (CN); Weiqiang Zeng, Guangdong (CN); Tingbo Dong, Guangdong (CN); Chaoming Huang, Guangdong (CN)

(73) Assignee: Foshan Evercore Optoelectronic Technology Co., Ltd., Foshan (CN)

( * ) Notice: Subject to any disclaimer, the term of this patent is extended or adjusted under 35 U.S.C. 154(b) by 0 days.

(21) Appl. No.: 17/699,248

(22) Filed: Mar. 21, 2022

(65) Prior Publication Data
US 2023/0299054 A1 Sep. 21, 2023

(51) Int. Cl.
*H01L 25/075* (2006.01)
*F21K 9/64* (2016.01)
*F21V 19/00* (2006.01)
*F21Y 115/10* (2016.01)

(52) U.S. Cl.
CPC ............ *H01L 25/0753* (2013.01); *F21K 9/64* (2016.08); *F21V 19/002* (2013.01); *F21Y 2115/10* (2016.08)

(58) Field of Classification Search
CPC ....... H01L 25/0753; F21K 9/64; F21V 19/002
See application file for complete search history.

(56) References Cited

U.S. PATENT DOCUMENTS

| 10,163,747 | B2* | 12/2018 | Heng | H01L 24/96 |
| 11,083,059 | B2* | 8/2021 | Francis | H01L 27/156 |
| 2006/0072314 | A1* | 4/2006 | Rains | H05B 45/20 362/231 |
| 2013/0032820 | A1* | 2/2013 | Wirth | H01L 25/0753 438/34 |
| 2013/0106276 | A1* | 5/2013 | Miyairi | H01L 33/50 313/498 |
| 2016/0149094 | A1* | 5/2016 | Onuma | H01L 33/504 257/89 |
| 2017/0047488 | A1* | 2/2017 | Kaneko | H01L 33/62 |
| 2019/0148590 | A1* | 5/2019 | Watanabe | G02F 1/133603 257/79 |
| 2019/0371768 | A1* | 12/2019 | You | H05B 45/20 |

* cited by examiner

*Primary Examiner* — Bryon T Gyllstrom

(57) ABSTRACT

The present disclosure provides a full-color COB device, including a substrate, where a light-emitting region is provided on an upper surface of the substrate, the light-emitting region includes a white light-emitting region and an atmosphere lighting region, the atmosphere lighting region is a closed ring-shaped structure, and the atmosphere lighting region encloses the white light-emitting region. A plurality of warm light-emitting modules and a plurality of cold light-emitting modules are disposed in the white light-emitting region, and the warm light-emitting module and the cold light-emitting module are disposed in a staggered manner. A plurality of red light-emitting modules, a plurality of green light-emitting modules, and a plurality of blue light-emitting modules are disposed in the atmosphere lighting region, and the red light-emitting modules, the green light-emitting modules, and the blue light-emitting modules are disposed in a staggered manner. This technical solution proposes a full-color COB device.

9 Claims, 4 Drawing Sheets

FULL-COLOR CHIP-ON-BOARD (COB) DEVICE

STATEMENT REGARDING PRIOR DISCLOSURES BY AN INVENTOR OR JOINT INVENTOR

The contents of Chinese Patent Application No. 202011438186.0 filed on Dec. 11, 2020 and published on Mar. 30, 2021, is a grace period disclosure and shall not be prior art to claimed invention.

TECHNICAL FIELD

The present disclosure relates to the technical field of chip-on-board (COB) light sources, and in particular, to a full-color COB device.

BACKGROUND

Most red green blue (RGB) dimming light emitting diode (LED) light sources on the market are generally bulb lights and panel lights. These light sources can only be used for flood lighting, while commercial lighting generally requires that light sources have small light-emitting surfaces. COB devices have an essential advantage of power density when being applied to commercial lighting, and may have small light-emitting surfaces with the same power, which is conducive to secondary optics design. Currently, although there are also RGB dimming COB devices and COB devices with adjustable cold light and warm light on the market, the white light mixing effect of an existing RGB dimming COB device is poor, and the adjustable color gamut range of an existing COB device with adjustable cold light and warm light is narrow. The above two types of dimming COB devices cannot satisfy the market requirement of high-end commercial lighting.

In the prior art, there is also a COB light source integrated with a RGB dimming chip and a cold and warm light dimming chip. However, in this COB light source, an RGB light-emitting region is generally located in the middle of a global light-emitting region, and a cold and warm light-emitting region is generally located at the edge of the global light-emitting region. When the RGB light-emitting region occupies a small area, impact on flare of white light is not obvious, but RGB power is excessively small and the dimming function cannot be fully performed. When the RGB light-emitting region occupies a large area and only white light illuminates, a light-emitting surface in the middle of the COB light source is a dark area, and secondary optical processing has a large impact on flare of the white light.

SUMMARY

The objective of the present disclosure is to propose a full-color COB device. The COB device has a small light-emitting region, but has a wide adjustable color range and a desirable light mixing effect, which helps to overcome the shortcomings in the prior art.

In order to achieve the above objective, the present disclosure adopts the following technical solutions:

A full-color COB device is disclosed, including a substrate, where a light-emitting region is provided on an upper surface of the substrate, the light-emitting region includes a white light-emitting region and an atmosphere lighting region, the atmosphere lighting region is a closed ring-shaped structure, and the atmosphere lighting region encloses the white light-emitting region; and a plurality of red light-emitting modules, a plurality of green light-emitting modules, and a plurality of blue light-emitting modules are disposed in the atmosphere lighting region, and the red light-emitting modules, the green light-emitting modules, and the blue light-emitting modules are disposed in a staggered manner.

Preferably, an area of the white light-emitting region may occupy 15% to 70% of that of the light-emitting region area according to an area percentage.

Preferably, a plurality of warm light-emitting modules and a plurality of cold light-emitting modules may be disposed in the white light-emitting region, and the warm light-emitting module and the cold light-emitting module may be disposed in a staggered manner.

Preferably, the warm light-emitting module may be a low color temperature CSP chip, and a color temperature range of the low color temperature CSP chip may be 1800K to 3500K.

Preferably, the cold light-emitting module may be a high color temperature CSP chip, a color temperature of the high color temperature CSP chip may be higher than that of the low color temperature CSP chip, and a color temperature range of the high color temperature CSP chip may be 3000K to 8000K.

Preferably, the cold light-emitting module may include an LED chip and a fluorescent glue layer, and the fluorescent glue layer may cover a top of the LED chip.

Preferably, the fluorescent glue layer may be a mixture of silica gel and phosphor, a color temperature of the phosphor may be higher than that of the low color temperature CSP chip, and a color temperature range of the phosphor may be 3000K to 8000K.

Preferably, the full-color COB device may further include a dam, where the dam protrudes from the upper surface of the substrate, and the dam is located between the white light-emitting region and the atmosphere lighting region.

Preferably, the red light-emitting module may be a red LED chip, the green light-emitting module may be a green LED chip, the blue light-emitting module may be a blue LED chip, and the red LED chip, the green LED chip, and the blue LED chip may be any one of a face-up LED chip, a flip LED chip, or a vertical LED chip.

Preferably, the full-color COB device may further include a package layer, where the package layer is configured to cover the light-emitting region.

The present disclosure has the following beneficial effects:

1. In this technical solution, the atmosphere lighting region encloses the white light-emitting region. Compared with the prior art, the flare effect formed by the white light-emitting region is not affected while the high-power atmosphere lighting region is implemented. In addition, this facilitates subsequent optical processing.
2. In this technical solution, a plurality of warm light-emitting modules and a plurality of cold light-emitting modules are disposed in the white light-emitting region, and the warm light-emitting module and the cold light-emitting module are disposed in a staggered manner. This helps to improve the effect of mixing cold light and warm light, thereby further facilitating subsequent optical processing.
3. In this technical solution, a plurality of red light-emitting modules, a plurality of green light-emitting modules, and a plurality of blue light-emitting modules are disposed in the atmosphere lighting region, and the red light-emitting modules, the green light-emitting modules, and the blue light-emitting modules are disposed in a staggered manner. This helps to ensure that light emitted by the atmosphere lighting region is evenly mixed in color after optical processing.

BRIEF DESCRIPTION OF THE DRAWINGS

The accompanying drawings further describe the present disclosure. However, the contents in the accompanying drawings do not form any limit to the present disclosure.

Figure 1:
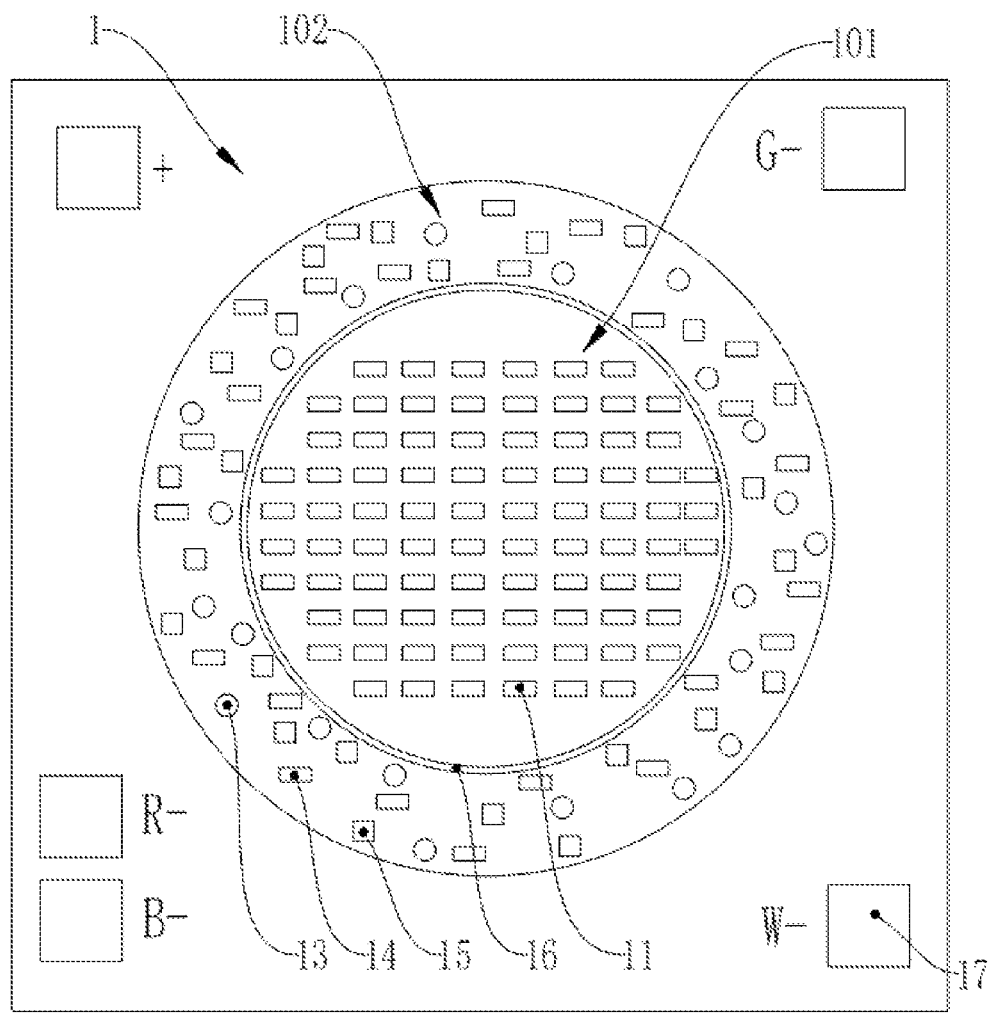
FIG. 1 is a structural schematic diagram of an embodiment of a full-color COB device according to the present disclosure.

Substrate 1, white light-emitting region 101, warm light-emitting module 11, cold light-emitting module 12, atmosphere lighting region 102, red light-emitting module 13, green light-emitting module 14, blue light-emitting module 15, dam 16, pad 17, and fast wiring terminal 18.

DETAILED DESCRIPTION

The technical solutions of the present disclosure will be further described below in detailed implementations with reference to the accompanying drawings.

Figure 2:
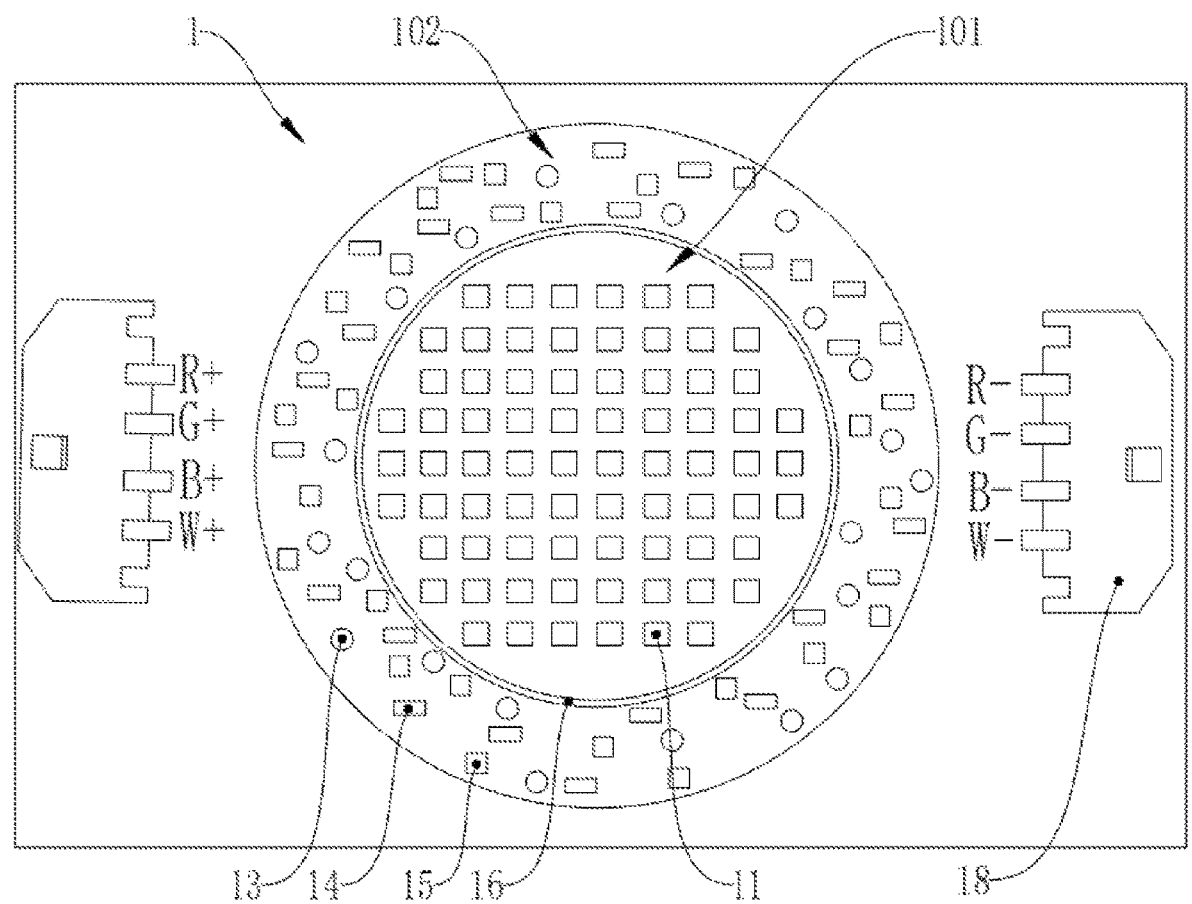
FIG. 2 is a structural schematic diagram of an embodiment of a full-color COB device according to the present disclosure.

As shown in FIG. 1 and FIG. 2, a full-color COB device includes a substrate 1, where a light-emitting region is provided on an upper surface of the substrate 1, the light-emitting region includes a white light-emitting region 101 and an atmosphere lighting region 102, the atmosphere lighting region 102 is a closed ring-shaped structure, and the atmosphere lighting region 102 encloses the white light-emitting region 101.

A plurality of red light-emitting modules 13, a plurality of green light-emitting modules 14, and a plurality of blue light-emitting modules 15 are disposed in the atmosphere lighting region 102, and the red light-emitting modules 13, the green light-emitting modules 14, and the blue light-emitting modules 15 are disposed in a staggered manner.

Most RGB dimming LED light sources on the market are generally bulb lights and panel lights. These light sources can only be used for flood lighting, while commercial lighting generally requires that light sources have small light-emitting surfaces. COB devices have an essential advantage of power density when being applied to commercial lighting, and may have small light-emitting surfaces with the same power, which is conducive to secondary optics design. Currently, although there are also RGB dimming COB devices and COB devices with adjustable cold light and warm light on the market, the white light mixing effect of an existing RGB dimming COB device is poor, and the adjustable color gamut range of an existing COB device with adjustable cold light and warm light is narrow. The above two types of dimming COB devices cannot satisfy the market requirement of high-end commercial lighting.

In the prior art, there is also a COB light source integrated with a RGB dimming chip and a cold and warm light dimming chip. However, in an existing COB light source, an RGB light-emitting region is generally located in the middle of a global light-emitting region, and a light-emitting region of a cold and warm light-emitting region is generally located at the edge of the global light-emitting region. When the RGB light-emitting region occupies a small area, impact on flare of white light is not obvious, but RGB power is excessively small and the dimming function cannot be fully performed. When the RGB light-emitting region occupies a large area and only white light illuminates, a light-emitting surface in the middle of the COB light source is a dark area, and secondary optical processing has a large impact on flare of the white light.

To resolve the technical problem of the existing RGB dimming COB light source, this technical solution proposes a full-color COB device. The COB device has a small light-emitting region, but has a wide adjustable color range and a desirable light mixing effect. Specifically, the full-color COB device includes a substrate 1, where a light-emitting region is provided on an upper surface of the substrate 1, the light-emitting region includes a white light-emitting region 101 and an atmosphere lighting region 102, the atmosphere lighting region 102 is a closed ring-shaped structure, and the atmosphere lighting region 102 encloses the white light-emitting region 101. Because the atmosphere lighting region 102 mainly serves to assist the atmosphere in the full-color COB light source, it is required that power of the atmosphere lighting region 102 cannot be excessively low, and at the same time, cannot affect the lighting effect of the white light-emitting region 101. It is required that the white light-emitting region 101 has a desirable flare effect, flare brightness and color cannot be uneven during dimming, and the like. Therefore, in this technical solution, the atmosphere lighting region 102 encloses the white light-emitting region 101. The flare effect formed by the white light-emitting region 101 is not affected while the high-power atmosphere lighting region 102 is implemented. In addition, because the optical processing, especially light concentrating processing, of the COB light source requires a concentrated focus. If the white light-emitting region that needs to be processed is not sufficiently concentrated, it is difficult to perform optical processing on the white light-emitting region. Therefore, in this technical solution, the white light-emitting region 101 is located in the middle of the light-emitting region, which is more conducive to subsequent optical processing.

Further, in this technical solution, a plurality of red light-emitting modules 13, a plurality of green light-emitting modules 14, and a plurality of blue light-emitting modules 15 are disposed in the atmosphere lighting region 102, and the red light-emitting modules 13, the green light-emitting modules 14, and the blue light-emitting modules 15 are disposed in a staggered manner. This helps to ensure that light emitted by the atmosphere lighting region 102 is evenly mixed in color after optical processing.

Preferably, in this technical solution, the full-color COB device further includes a pad 17 or a fast wiring terminal 18, the pad 17 or the fast wiring terminal 18 is mounted on the upper surface of the substrate 1, and the light-emitting module is electrically connected to a drive power supply through the pad 17 or the fast wiring terminal 18.

Preferably, the substrate 1 is a metal substrate or a ceramic substrate. In an embodiment of this technical solution, the substrate 1 is a metal substrate or a ceramic substrate, and the type of the substrate 1 can be specifically selected according to the actual need. The metal substrate helps to improve the heat dissipation effect of the COB device, and can effectively avoid that heat accumulation affects the service life of the COB device.

Further, an area of the white light-emitting region 101 occupies 15% to 70% of that of the light-emitting region area according to an area percentage.

In an embodiment of this technical solution, the area of the white light-emitting region 101 occupies 15% to 70% of that of the light-emitting region area according to an area percentage. The size of the area of the white light-emitting region 101 affects the quality of the flare effect formed by the white light-emitting region 101. Therefore, to ensure that the full-color COB device in this technical solution emits flare with a desirable effect, the ratio of the area of the white light-emitting region 101 to that of the light-emitting region is limited to 15% to 70% in this technical solution.

Figure 3:
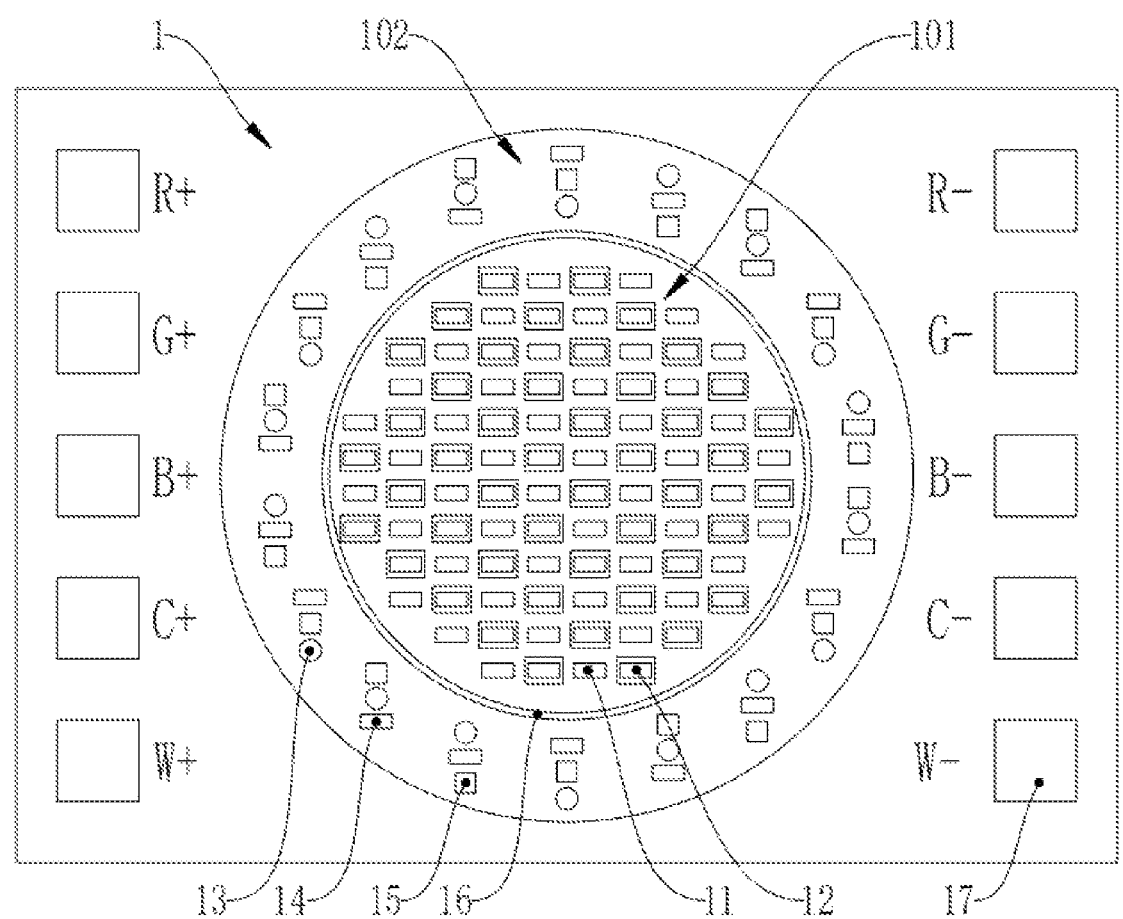
FIG. 3 is a structural schematic diagram of an embodiment of a full-color COB device according to the present disclosure.
Figure 4:
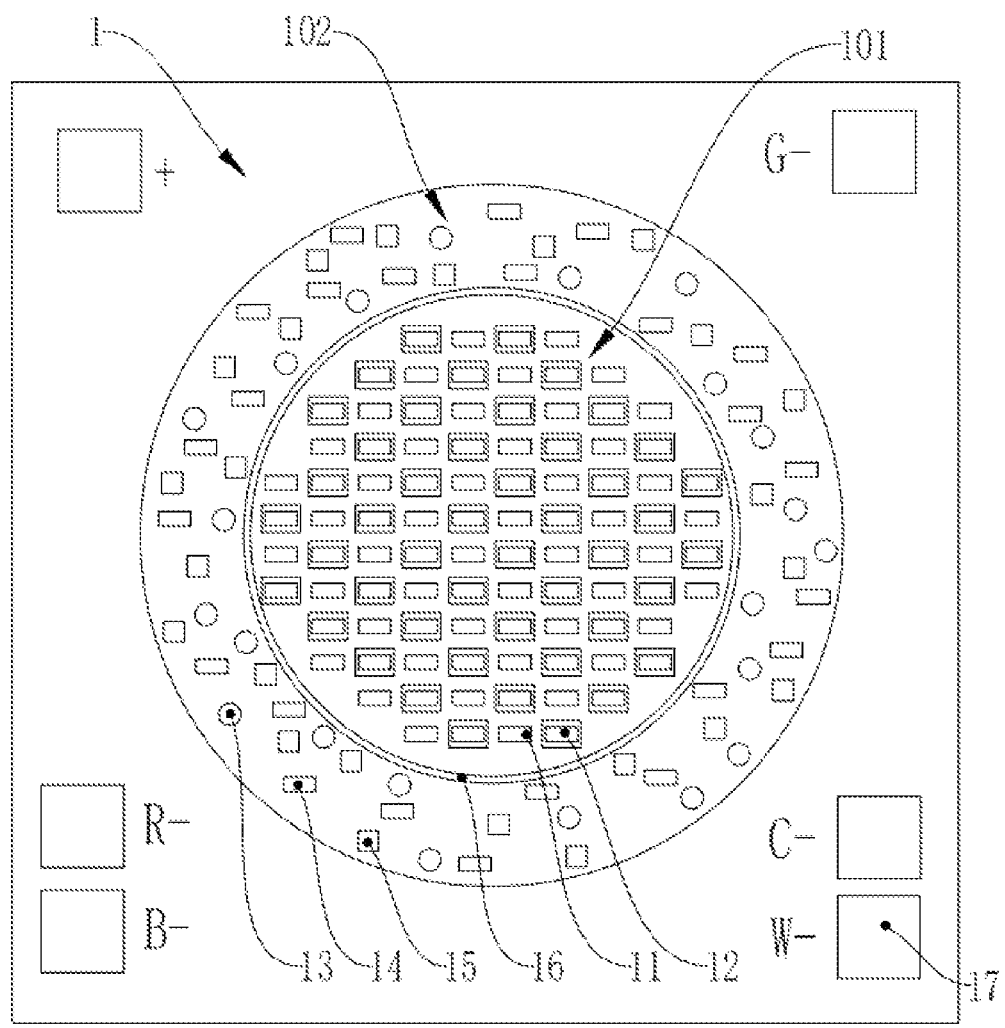
FIG. 4 is a structural schematic diagram of an embodiment of a full-color COB device according to the present disclosure.

Further, as shown in FIG. 3 and FIG. 4, a plurality of warm light-emitting modules 11 and a plurality of cold light-emitting modules 12 are disposed in the white light-emitting region 101, and the warm light-emitting module 11 and the cold light-emitting module 12 are disposed in a staggered manner.

Further, in this technical solution, a plurality of warm light-emitting modules 11 and a plurality of cold light-emitting modules 12 are disposed in the white light-emitting region 101, and the warm light-emitting module 11 and the cold light-emitting module 12 are disposed in a staggered manner. This helps to improve the effect of mixing cold light and warm light, thereby further facilitating subsequent optical processing.

Further, the warm light-emitting module 11 is a low color temperature CSP chip, and a color temperature range of the low color temperature CSP chip is 1800K to 3500K.

Further, the cold light-emitting module 12 is a high color temperature CSP chip, a color temperature of the high color temperature CSP chip is higher than that of the low color temperature CSP chip, and a color temperature range of the high color temperature CSP chip is 3000K to 8000K.

Further, the cold light-emitting module 12 includes an LED chip and a fluorescent glue layer, and the fluorescent glue layer covers a top of the LED chip.

Further, the fluorescent glue layer is a mixture of silica gel and phosphor, a color temperature of the phosphor is higher than that of the low color temperature CSP chip, and a color temperature range of the phosphor is 3000K to 8000K.

Further, the full-color COB device further includes a dam 16, where the dam 16 protrudes from the upper surface of the substrate 1, and the dam 16 is located between the white light-emitting region 101 and the atmosphere lighting region 102.

In an embodiment of this technical solution, the cold light-emitting module 12 may be a high color temperature CSP chip. In another embodiment of this technical solution, the cold light-emitting module 12 may include an LED chip and a high color temperature fluorescent glue layer. When the cold light-emitting module 12 includes an LED chip and a high color temperature fluorescent glue layer, to prevent fluorescent glue from covering the red light-emitting module 13, the green light-emitting module 14, and the blue light-emitting module 15 in the atmosphere lighting region 102 during dispensing, the dam 16 is further disposed in the full-color COB device in this technical solution. The dam 16 protrudes from the upper surface of the substrate 1, and is located between the white light-emitting region 101 and the atmosphere lighting region 102. The disposed dam 16 effectively separates the white light-emitting region 101 from the atmosphere lighting region 102, to effectively prevent the light-emitting module in the atmosphere lighting region 102 from being excited by the high color temperature fluorescent glue layer and changing in color.

Further, the red light-emitting module 13 is a red LED chip, the green light-emitting module 14 is a green LED chip, the blue light-emitting module 15 is a blue LED chip, and the red LED chip, the green LED chip, and the blue LED chip may be any one of a face-up LED chip, a flip LED chip, or a vertical LED chip.

In an embodiment of this technical solution, the red LED chip, the green LED chip, and the blue LED chip may be any one of a face-up LED chip, a flip LED chip, or a vertical LED chip, which may be selected according to actual needs.

Further, the full-color COB device further includes a package layer, where the package layer is configured to cover the light-emitting region.

In an embodiment of this technical solution, the package layer in this technical solution may be a transparent silicone layer or a slightly milky white glue layer with a diffusion effect, which may be selected according to actual needs.

The technical principles of the present disclosure are described above with reference to the specific embodiments. These descriptions are merely intended to explain the principles of the present disclosure, and may not be construed as limiting the protection scope of the present disclosure in any way. Therefore, those skilled in the art may derive other specific implementations of the present disclosure without creative effort, but these implementations should fall within the protection scope of the present disclosure.

The invention claimed is:

1. A full-color chip-on-board (COB) device, comprising a substrate, wherein a light-emitting region is provided on an upper surface of the substrate, the light-emitting region comprises a white light-emitting region and an atmosphere lighting region, the atmosphere lighting region is a closed ring-shaped structure, and the atmosphere lighting region encloses the white light-emitting region; and a plurality of red light-emitting modules, a plurality of green light-emitting modules, and a plurality of blue light-emitting modules are disposed in the atmosphere lighting region, and the red light-emitting modules, the green light-emitting modules, and the blue light-emitting modules are disposed in a staggered manner;

wherein a plurality of warm light-emitting modules and a plurality of cold light-emitting modules are disposed in the white light-emitting region, and the warm light-emitting module and the cold light-emitting module are disposed in a staggered manner.

2. The full-color COB device according to claim 1, wherein an area of the white light-emitting region occupies 15% to 70% of that of the light-emitting region area according to an area percentage.

3. The full-color COB device according to claim 1, wherein each of the warm light-emitting modules is a low color temperature chip scale package (CSP) chip, and a color temperature range of the low color temperature CSP chip is 1800K to 3500K.

4. The full-color COB device according to claim 3, wherein each of the cold light-emitting modules is a high color temperature CSP chip, a color temperature of the high color temperature CSP chip is higher than that of the low color temperature CSP chip, and a color temperature range of the high color temperature CSP chip is 3000K to 8000K.

5. The full-color COB device according to claim 3, wherein each of the cold light-emitting modules comprises a light emitting diode (LED) chip and a fluorescent glue layer, and the fluorescent glue layer covers a top of the LED chip.

6. The full-color COB device according to claim 5, wherein the fluorescent glue layer is a mixture of silica gel and phosphor, a color temperature of the phosphor is higher than that of the low color temperature CSP chip, and a color temperature range of the phosphor is 3000K to 8000K.

7. The full-color COB device according to claim 6, further comprising a dam, wherein the dam protrudes from the upper surface of the substrate, and the dam is located between the white light-emitting region and the atmosphere lighting region.

8. The full-color COB device according to claim 1, wherein each of the red light-emitting modules is a red LED chip, each of the green light-emitting modules is a green LED chip, each of the blue light-emitting modules is a blue LED chip, and the red LED chip, the green LED chip, and the blue LED chip each are any one of a face-up LED chip, a flip LED chip, or a vertical LED chip.

9. The full-color COB device according to claim 1, further comprising a package layer, wherein the package layer is configured to cover the light-emitting region.

* * * * *